United States Patent
Misumi et al.

(10) Patent No.: US 6,614,101 B2
(45) Date of Patent: *Sep. 2, 2003

(54) LEAD FRAME WITH RAISED LEADS AND PLASTIC PACKAGED SEMICONDUCTOR DEVICE USING THE SAME

(75) Inventors: Kazuyuki Misumi, Tokyo (JP); Kazunari Michii, Tokyo (JP); Manabu Horita, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/579,268

(22) Filed: May 26, 2000

(65) Prior Publication Data

US 2002/0105060 A1 Aug. 8, 2002

(30) Foreign Application Priority Data

Nov. 25, 1999 (JP) .............................. 11-334750

(51) Int. Cl.⁷ .............................................. H01L 23/495
(52) U.S. Cl. ...................... 257/666; 257/668; 257/673; 257/674
(58) Field of Search ................. 257/166, 670, 257/673, 667, 668, 669, 674; 438/123

(56) References Cited

U.S. PATENT DOCUMENTS

| 5,172,214 A | * | 12/1992 | Casto | 257/676 |
|---|---|---|---|---|
| 5,303,120 A | * | 4/1994 | Michii et al. | 361/760 |
| 5,349,238 A | * | 9/1994 | Ohsawa | 257/736 |
| 5,559,366 A | * | 9/1996 | Fogal | 257/666 |
| 5,874,783 A | * | 2/1999 | Yamada | 257/778 |
| 5,900,582 A | * | 5/1999 | Tomita et al. | 174/52.2 |
| 5,917,235 A | * | 6/1999 | Imura | 257/666 |
| 6,043,430 A | * | 3/2000 | Chun | 257/672 |
| 6,046,504 A | * | 4/2000 | Kimura | 257/668 |
| 6,066,887 A | * | 5/2000 | Hong | 257/668 |
| 6,258,624 B1 | * | 7/2001 | Corisis | 438/106 |
| 6,258,629 B1 | * | 7/2001 | Niones et al. | 438/111 |
| 6,297,544 B1 | * | 10/2001 | Nakamura et al. | 257/666 |
| 6,303,981 B1 | * | 10/2001 | Moden | 257/666 |
| 6,316,822 B1 | * | 11/2001 | Venkateshwaran et al. | 257/666 |
| 6,331,738 B1 | * | 12/2001 | Kimura | 257/692 |
| 6,376,903 B1 | * | 4/2002 | Kim | 257/678 |
| 2002/0056924 A1 | * | 5/2002 | Chung et al. | 257/784 |

FOREIGN PATENT DOCUMENTS

| JP | 5-121635 | | 5/1993 |
| JP | 405144954 A | * | 6/1993 |
| JP | 8-46094 | | 2/1996 |
| JP | 10-56032 | | 2/1998 |

* cited by examiner

Primary Examiner—Wael Fahmy
Assistant Examiner—Nathan W. Ha
(74) Attorney, Agent, or Firm—McDermott, Will & Emery

(57) ABSTRACT

A plastic packaged semiconductor device is constructed by sealing, with a sealing plastic, a semiconductor chip which has an electrode pad arranged in a central portion of an upper surface, a die pad to which the semiconductor chip is die-bonded, bonding wires which are connected to the electrode pad, and inner leads which are arranged in close vicinity of the die pad and have tip portions having upper flat surfaces which are positioned at a level equal to or higher than the upper surface of the semiconductor chip and to which the bonding wires are connected. Accordingly, the small thin plastic packaged semiconductor device in which the bonding wires do never come into contact with the edge of the semiconductor chip can be achieved.

7 Claims, 6 Drawing Sheets

OUTER SIDE SURFACE
OF SEAL PLASTIC

LEAD FRAME WITH RAISED LEADS AND PLASTIC PACKAGED SEMICONDUCTOR DEVICE USING THE SAME

BACKGROUND OF THE INVENTION

1. Field of the Invention

The present invention relates to a small thin plastic packaged semiconductor device having electrode pads in a central area of an upper surface of a semiconductor chip and, more particularly, to a lead frame capable of achieving the wire bonding of high reliability by preventing the contact of bonding wires to a chip edge and a semiconductor device using the same.

2. Description of the Related Art

In recent years, reduction in size and thickness is required of the semiconductor device more and more with the increase in integration and function, and thus the technological developments therefor proceed. Especially, in the fields such as the memory card, the memory module, etc. in which the high density packaging is requested, the request for reduction in size and thickness of the package is being made strongly. The package standard based on TSOP (Thin Small Out-line Package) standard is widely employed at present, nevertheless further reduction in size and thickness of the package is required.

One of the problems caused when the reduction in size and thickness of the plastic packaged semiconductor device advances is that the bonding wire comes into contact with the edge of the semiconductor chip. Various improvements have been made to prevent this problem. For example, in Japanese Patent Unexamined Publication No. Hei. 5-121635, in such a semiconductor device that the inner leads are arranged in close vicinity of the electrode pads which are located on the surface of the upper end portion of the semiconductor chip, an improved lead frame is disclosed. That is, since a height of the upper surfaces of the inner leads to which the wires are connected is set equally to surfaces of the electrode pads of the semiconductor chip mounted on the die pad to eliminate difference in level between them, the wire bonding can be applied to such lead frame not to bring the wires into contact with the edge of the semiconductor chip even when deformation, dip, etc. are caused in the short wire or the long wire.

Also, in Japanese Patent Unexamined Publication No. Hei. 10-56032, as such a semiconductor device that the inner Leads are arranged in close vicinity of the electrode pads in which the electrodes of the semiconductor chip are arranged on the surface of the upper end portion of the chip, an improved semiconductor device is disclosed. That is, in the semiconductor device which includes the die pad, the semiconductor chip, the lead frame, the bonding wires, and the molding plastic, since a level of the die pad can be lowered such that the height of the upper surfaces of the inner leads and a height of the upper surfaces of the bonding wire balls are set to a substantially identical level, deformation of the bonding wire balls during the wire bonding and deformation and cutting of the bonding wires at the boundary between the bonding wires and the bonding wire balls can be prevented, and thus the bonding wires are in no way brought into contact with the edge of the semiconductor chip.

As described above, the plastic packaged semiconductor devices in the related art have constructed to overcome the technological subjects caused to reduce the thickness of the package in which the inner leads are arranged in close vicinity to the electrode pads being arranged on the surface of the upper end portion of the semiconductor chip. In other words, in such semiconductor device that the inner leads are arranged in close vicinity to the electrode pads being arranged on the surface of the upper end portion of the semiconductor chip, since a bending curve of the bonding wires becomes sharp when the loop length is set short and the loop height is formed low, an excessive force is applied to the recrystallized portion of the bonding wires located immediately over the bonding wire balls, whereby the deformation or cutting of the bonding wires is easily caused. The above plastic packaged semiconductor devices in the related art can overcome these disadvantages and also can prevent the event that the bonding wires come into contact with the edge of the semiconductor chip because of the deformation or dip of the wire. However, even if these technological subjects can be overcome according to the above configuration, the plastic packaged semiconductor devices in the related art are not yet enough to answer the request for the further size reduction of the plastic packaged semiconductor device, which is requested in the market.

SUMMARY OF THE INVENTION

The present invention has been made to overcome the above-mentioned problems, and it is an object of the present invention to provide a lead frame of high reliability and a plastic packaged semiconductor device using the same, which are capable of reducing a thickness and a size of the package, preventing not only deformation or cutting of bonding wires but also contact of the bonding wires to an edge of a semiconductor chip, and bringing about no reduction in production yield because of the exposure of the bonding wires and a die pad in plastic packaging, by using a semiconductor chip in which an electrode pad is arranged on an upper surface of a central portion, which has a high integration density, of the semiconductor chip in place of a semiconductor chip in which the electrode pad is arranged on the upper surface of the end portion of the semiconductor chip.

In order to achieve the above object, according to a first aspect of the present invention, there is provided a lead frame comprising: a die pad on which a semiconductor chip having an electrode pad in a central portion of an upper surface is die-bonded; lifted leads which support the die pad; and inner leads which are arranged in close vicinity of the die pad and have tip portions having upper flat surfaces, which are in parallel with a surface of the die pad and to which bonding wires are connected, wherein the upper flat surfaces of the tip portions of the inner leads are arranged more highly than the upper surface of the semiconductor chip by at least a dimension which is equivalent to a diameter of the bonding wires.

According to a second aspect of the present invention, there is provided a lead frame comprising: a die pad on which a semiconductor chip having an electrode pad in a central portion of an upper surface is die-bonded; lifted leads which support the die pad; and inner leads which are arranged in close vicinity of the die pad and have tip portions having upper flat surfaces, which are in parallel with a surface of the die pad and to which bonding wires are connected, wherein the upper flat surfaces of the tip portions of the inner leads are arranged at a substantially same height as a maximum lifting height of the bonding wires which are connected to the electrode pad, then lifted to form a loop, and then connected to the upper flat surfaces.

According to a third aspect of the present invention, there is provided a plastic packaged semiconductor device comprising: a semiconductor chip which has an electrode pad arranged in a central portion of an upper surface; a die pad to which the semiconductor chip is die-bonded; bonding wires connected to the electrode pad; inner leads which are arranged in close vicinity of the die pad and have tip portions having upper flat surfaces which are positioned at a level equal to or higher than an upper surface of the semiconductor chip and to which the bonding wires are connected; and a sealing plastic for sealing the semiconductor chip, the die pad, the bonding wires, and the inner leads.

DETAILED DESCRIPTION OF THE PREFERRED EMBODIMENTS

Embodiments of the present invention will be explained with reference to the accompanying drawings hereinafter.

Embodiment 1

Figure 1:
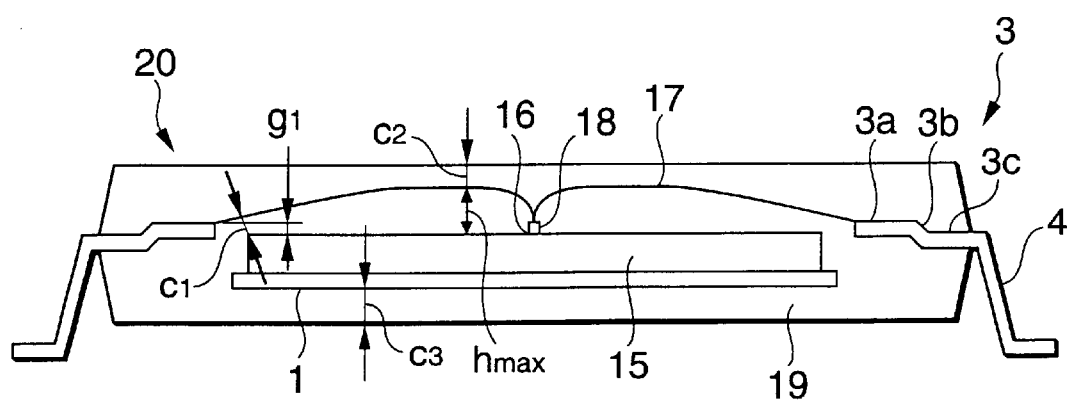
FIG. 1 is a sectional view showing a plastic packaged semiconductor device according to an embodiment 1 of the present invention.

A plastic packaged semiconductor device according to an embodiment 1 of the present invention will be explained with reference to FIGS. 1 to 6 hereinbelow. FIG. 1 is a sectional view showing a plastic packaged semiconductor device according to the embodiment 1 of the present invention. In FIG. 1, reference numeral 1 denotes a die pad to which a semiconductor chip 15 on which an integrated circuit is formed is solidly die-bonded. Reference numeral 16 denotes electrode pads of an integrated circuit, which are formed of a plurality of aluminum films (not shown) arranged in a central portion of an upper surface of the semiconductor chip 15. Reference numeral 3 denotes inner leads, and an inner lead tip portion 3a of the inner lead 3 is bent upwardly from an inner lead root portion 3c via a bent portion 3b in parallel with a surface of the semiconductor chip 15. In this case, the die pad 1 is arranged by the depress molding at a position below a level of the inner lead root portion 3c up to a depth in accordance with a thickness of the semiconductor chip 15 to be mounted. Reference numeral 4 denotes outer leads connected to the inner leads 3, and reference numeral 17 denotes bonding wires which electrically connect the electrode pads 16 of the semiconductor chip 15 and the inner leads 3. The bonding wires are formed of gold (Au) whose purity is in excess of 99.99%, and normally thin gold wires of $\phi 20$ to $\phi 30$ $\mu$m diameter are used in the wire bonding.

More particularly, an Au ball (not shown) is formed at a tip portion of one end of the bonding wire 17, which is passed through a capillary of a wire bonding machine, by using a torch (not shown), then the Au ball is press-bonded onto the electrode pad 16 by the capillary to form the bonding wire ball 18, then the bonding wire 17 is lifted to form the loop, and then other end of the bonding wire 17 is bonded onto the upper surface of the inner lead tip portion 3a of the inner lead 3 by the stitch bonding. In this case, since the loop length becomes long like about 4 to 5 mm and also a curvature of the bonding wire 17 after the ball bonding does not become sharp rather than the above semiconductor device in the related art in which the electrode pads 16 are arranged at the end portion of the semiconductor chip 15, the excessive force is not applied to the recrystallized portion of the bonding wire 17 located immediately over the bonding wire ball 18, whereby the deformation or cutting of the bonding wire 17 is difficult to be caused. In this case, it is preferable from the viewpoint of reliability that at least 50 $\mu$m should be assured as an interval $c_1$ between the edge of the semiconductor chip 15 and the bonding wire 17. Therefore, an upper surface position of the inner lead tip portion 3a should be set at least up to the same height level as an upper surface of the semiconductor chip 15 mounted on the die pad 1. Preferably, the inner lead tip portion 3a should be formed highly such that a distance $g_1$ between a height level of the upper surface of the inner lead tip portion 3a and a height level of the upper surface of the semiconductor chip 15 has at least a value equivalent to a diameter of the bonding wire 17. In this embodiment 1, the inner lead tip portion 3a is formed highly to have the distance $g_1$ of about 55 $\mu$m. As a result, the interval $c_1$ in excess of 161 $\mu$m has been achieved.

In this manner, after the wire bonding, a sealing plastic 19 is formed with epoxy resin by using the transfer molding method to seal the die pad 1, the inner leads 3, the semiconductor chip 15, and the bonding wires 17, and then the outer leads 4 are formed as shown in FIG. 1, whereby a plastic packaged semiconductor device 20 is completed. In this case, both an interval $c_2$ between an upper surface of the sealing plastic 19 and the bonding wires 17 and an interval $c_3$ between a lower surface of the sealing plastic 19 and a bottom surface of the die pad 1 are set to exceed at least 50 $\mu$m or more. Thus, the die pad 1 and the bonding wires 17 can be prevented from being exposed from the sealing plastic 19. As a result, a thin package of high quality can be formed.

As described above, in the plastic packaged semiconductor device according to the embodiment 1, the die pad 1, the semiconductor chip 15 having the electrode pads 16 which are die-bonded onto the die pad 1 in the central portion of its upper surface, the inner leads 3 whose inner lead tip portions 3a are formed highly at a height level of the distance $g_1$, which is equivalent to the diameter of the bonding wire 17, from a height level of the surface of the semiconductor chip 15, and the bonding wires 17 which connect electrically the electrode pads 16 and the inner lead tip portions 3a respectively are plastic packaged. Therefore, the thickness and the size of the package can be reduced, and the contact of the bonding wires to the edge of the semiconductor chip as well as the deformation or cutting of the bonding wires can be prevented, and reduction in production yield because of the exposure of the bonding wires 17 or the die pad 1 cannot be brought about at the time of plastic packaging. As a result, the plastic packaged semiconductor device of high reliability can be achieved.

Figure 2:
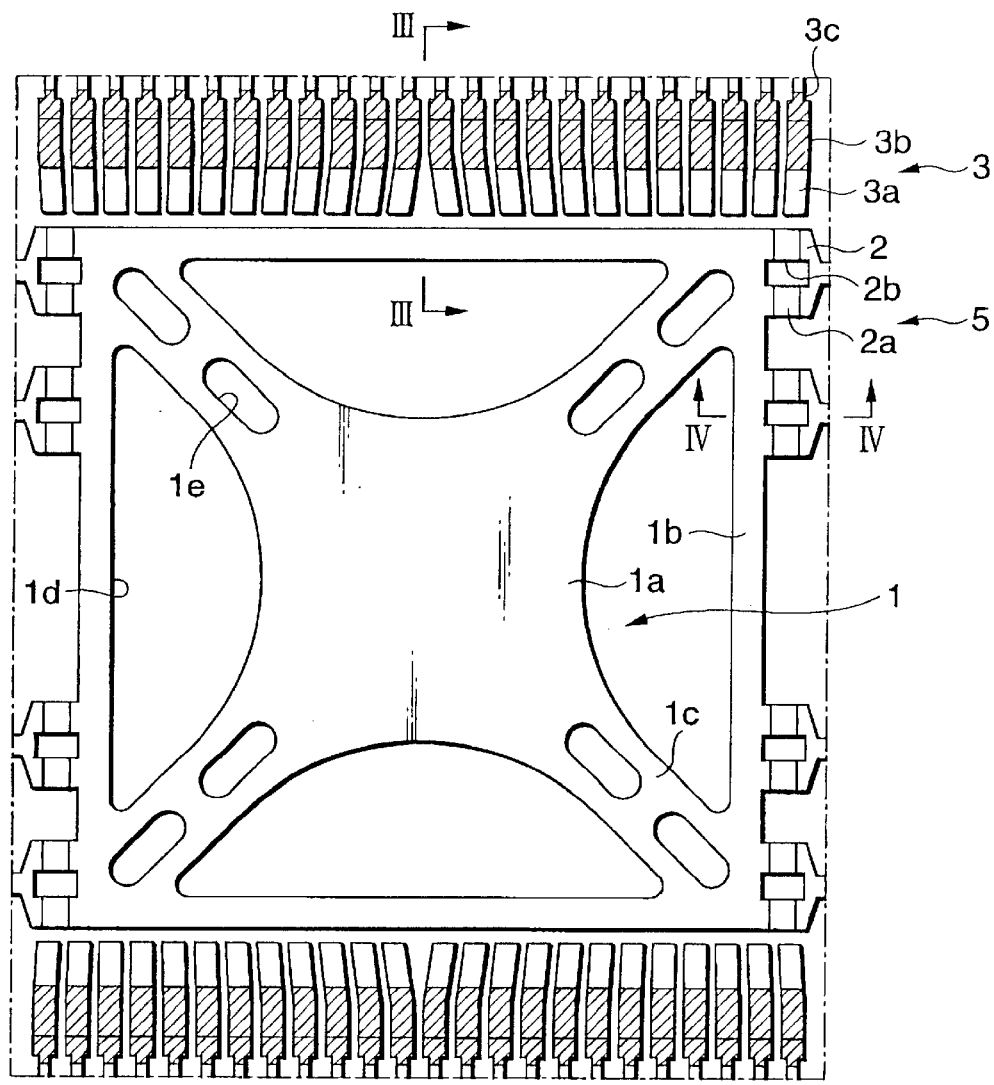
FIG. 2 is a plan view showing a semiconductor device sealing portion of a lead frame of the plastic packaged semiconductor device according to the embodiment 1 of the present invention.
Figure 3:
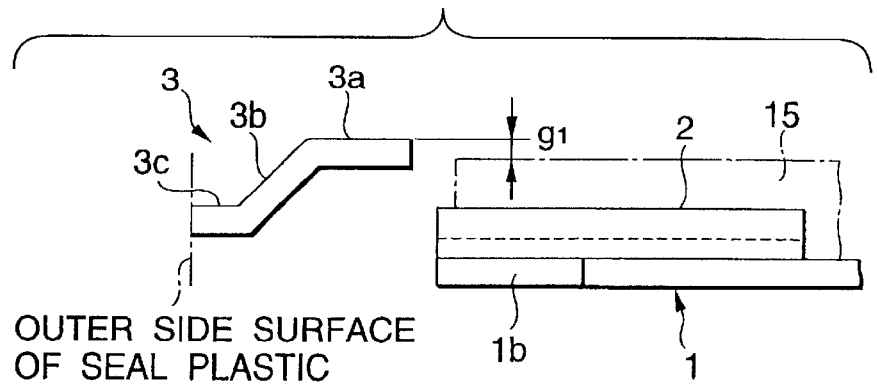
FIG. 3 is a sectional view showing a sectional shape of the sealing portion of the lead frame, taken along the III—III direction in FIG. 2.
Figure 4:
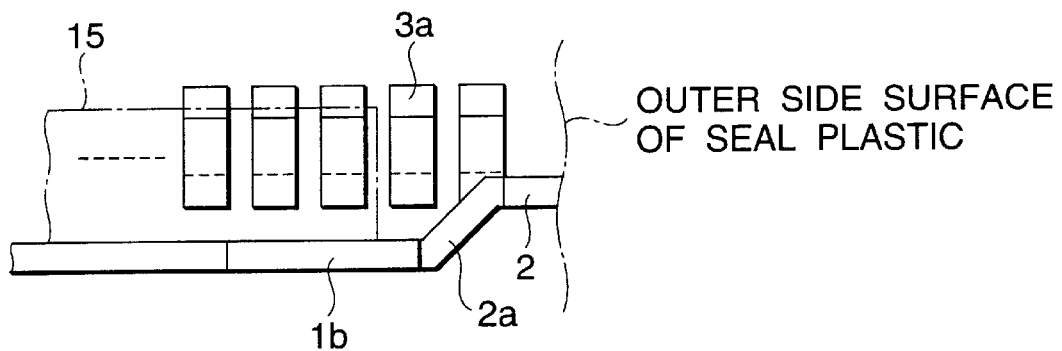
FIG. 4 is a sectional view showing a sectional shape of the sealing portion of the lead frame, taken along the IV—IV direction in FIG. 2.

Next, a configuration of the lead frame employed in the plastic packaged semiconductor device according to the embodiment 1 of the present invention will be explained hereunder. FIG. 2 is a plan view showing one semiconductor device sealing portion 5 of the lead frame of the plastic packaged semiconductor device. FIG. 3 is a sectional view showing the sealing portion 5 of the lead frame taken along the III—III direction in FIG. 2. FIG. 4 is a sectional view showing the sealing portion 5 of the lead frame taken along the IV—IV direction in FIG. 2. In FIG. 2, reference numeral 1a denotes a main pad portion; 1b, a pad frame portion; 1c, pad bridging portions which are bridged between the main pad portion 1a and the pad frame portion 1b; 2, lifted leads; and 2a, folded portions onto which the lifted leads 2 are depressed and which are formed as shown in FIG. 4. Since the folded portions 2a are formed, the main pad portion 1a, the pad frame portion 1b, and the pad bridging portions 1c can be formed to be lowered by a predetermined dimension in response to the thickness of the semiconductor chip 15 which is die-bonded. The die pad 1 is composed of the main pad portion 1a, the pad frame portion 1b, and the pad bridging portions 1c. Reference numerals 1d, 1e, and 2b denote an opening respectively, which are formed to make the plastic flow to respective parts smooth in plastic packaging. Then, the semiconductor chip 15 can be firmly stuck and secured by filling the plastic into the openings 1d and 1e. One semiconductor device sealing portion 5 of the lead frame is composed of the die pad 1, the lifted leads 2, and the inner leads 3. A dot-dash line shown in FIGS. 2 to 4 indicates an outer side surface of the sealing plastic 19. As shown in FIGS. 2 to 4, one end of the lifted lead 2 is connected to the pad frame portion 1b, while the other end thereof is connected to a vertical outer frame 8 or a lateral partition plate 9 (both not shown) of the lead frame 21 on which a plurality of semiconductor device sealing portions 5 are formed.

Also, as shown in FIG. 3, the hatched portion (near the bent portion 3b) of the inner lead 3 in FIG. 2 is formed such that the upper surface of the inner lead tip portion 3a is formed in parallel with a surface of the die pad 1 and the upper surface of the semiconductor chip 15 which is mounted on the die pad 1. An upper surface position of the inner lead tip portion 3a should be formed highly at least up to the same height level as the upper surface of the semiconductor chip 15 which is mounted on the die pad 1. Preferably, the inner lead tip portion 3a should be formed highly such that the distance $g_1$ between height levels of the upper surface of the inner lead tip portion 3a and the upper surface of the semiconductor chip 15 has at least a value which is equivalent to the diameter dimension of the bonding wire 17. Accordingly, the contact between the edge of the semiconductor chip 15 and the bonding wires 17 can be prevented without fail at the time of the wire bonding, and thus the semiconductor device of high reliability can be obtained.

Figure 5:
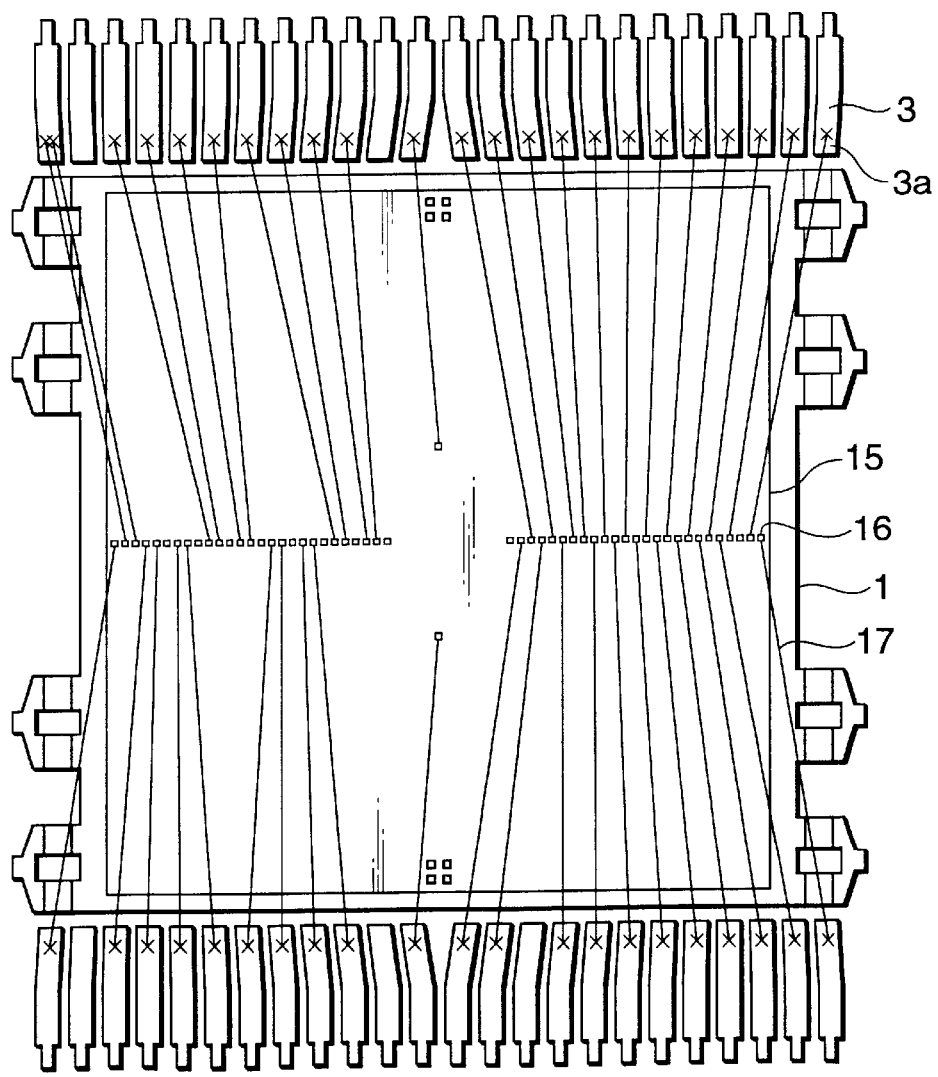
FIG. 5 is a plan view showing a semiconductor chip and its neighboring portion after the wire bonding step of the plastic packaged semiconductor device according to the embodiment 1 of the present invention has been finished.
Figure 6:
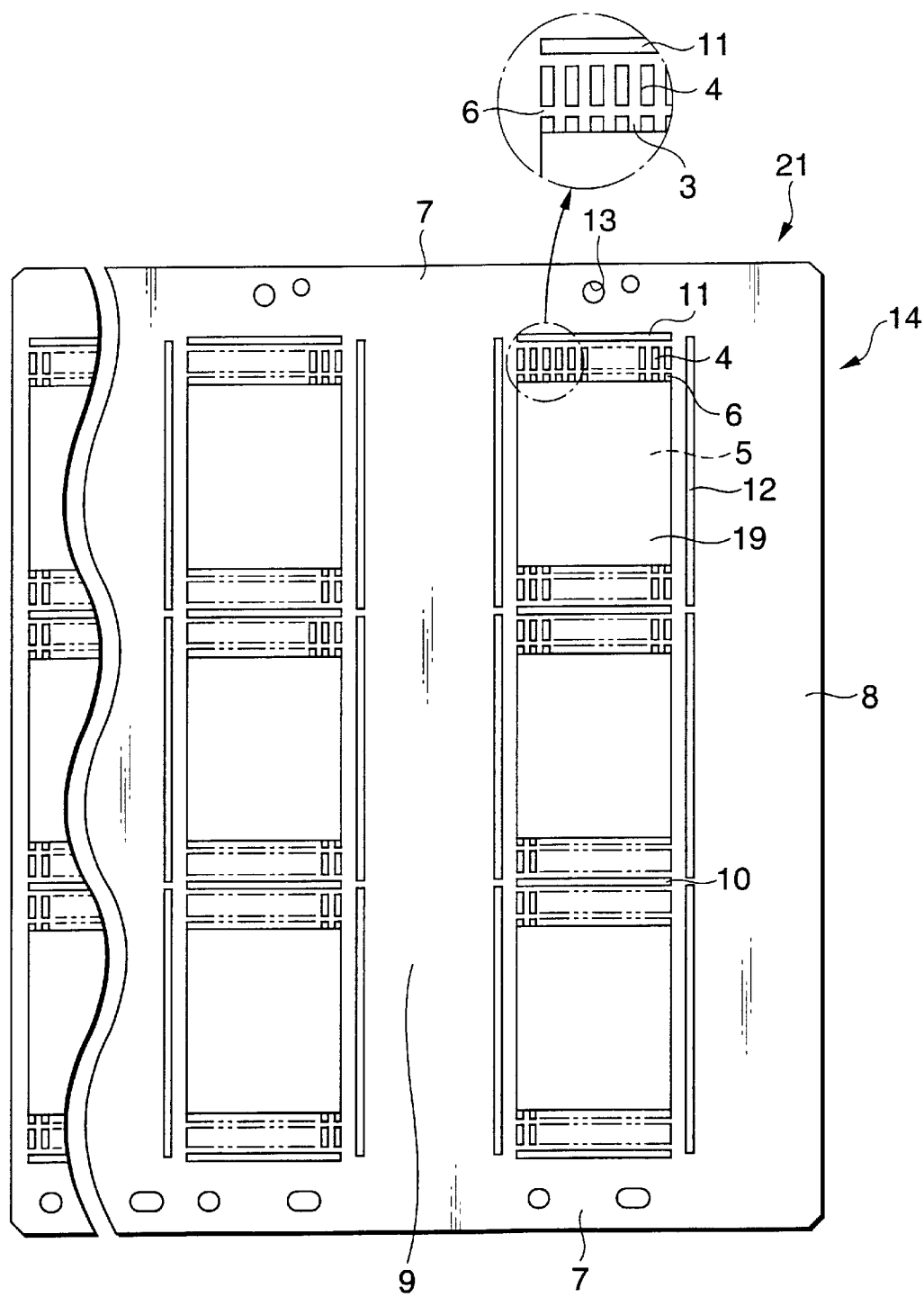
FIG. 6 is a plan view showing the lead frames after the plastic sealing step of the plastic packaged semiconductor device according to the embodiment 1 of the present invention has been finished.

Next, a method of forming the semiconductor device by mounting the semiconductor chip onto the above lead frame will be explained hereunder. FIG. 5 is a plan view showing the semiconductor chip and its neighboring portion after the wire bonding step of the plastic packaged semiconductor device has been finished. FIG. 6 is a plan view showing the lead frame after the plastic sealing step of the plastic packaged semiconductor device has been finished. As shown in FIG. 5, the electrode pads 16 are aligned in the central portion of the upper surface of the semiconductor chip 15, and the bonding wires 17 which are connected to the desired electrode pads 16 via the ball bonding are bonded onto the upper surfaces (X mark portions) of the inner lead tip portions 3a of the corresponding inner leads 3 via the stitch bonding. Then, the lead frame which has been subjected to the wire bonding step of the semiconductor chip 15 are set in a plastic packaging die (not shown), and then the sealing plastic 19 is formed with the epoxy resin by virtue of the transfer molding method to seal the die pad 1, the inner leads 3, the semiconductor chip 15, and the bonding wires 17.

As shown in FIG. 6, three semiconductor device sealing portions 5 shown in FIG. 2, each is formed of 42% Ni—Fe alloy material, are arranged vertically between parallel lateral outer frames 7 at upper and lower ends to be separated mutually by vertical partition plates 10, and then ten sets of such arrangements (not shown) arranged laterally between parallel vertical outer frames 8 at both ends to be separated mutually by lateral partition plates 9, whereby the lead frame 21 can be formed. Then, the outer leads 4 are connected mutually to the corresponding inner leads 3 via the tie rods 6 in the neighborhood of the outer surface of the sealing plastic 19 and also connected to the lateral outer frame 7 or the vertical partition plate 10. In addition, as described above, the lifted leads 2 are connected to the vertical outer frames 8 or the lateral partition plates 9, so that the above die pad 1 can be supported. Reference numeral 14 denotes a semiconductor device forming portion in the lead frame 21, which consists of the die pad 1, the lifted leads 2, the inner leads 3, the outer leads 4, and the tie rods 6. As described above, 30 semiconductor device forming portions 14 are formed in total. Reference numeral 11 denotes lateral slits provided in the vertical outer frames 8 or the vertical partition plates 10. Reference numeral 12 denotes vertical slits provided in the vertical outer frames 8 or the vertical partition plates 10, all prevent the bowing or the deformation of the lead frame 21 by balancing the thermal stress generated in the plastic packaging. Reference numeral 13 denotes feed holes which are opened in the lateral outer frame 7. Then, the tie rods 6, the outer leads 4, and the lifted leads 2 are cut off by the later step while feeding the lead frame 21 laterally via the feed holes 13. Then, the outer leads 4 are bent into a predetermined shape shown in FIG. 1 respectively, whereby the plastic packaged semiconductor device 20 according to the embodiment 1 can be completed.

In the embodiment 1 of the present invention, as shown in FIG. 2, the lead frame having multi-row frames, in which three semiconductor device sealing portions 5 are arranged vertically between the upper and lower parallel lateral outer frames 7 to be separated by the vertical partition plates 10, is disclosed. However, the lead frame in which one semiconductor device sealing portion 5 is formed may be employed. In addition, the lead frame using 42% Ni—Fe alloy material is also disclosed. However, the present invention is not limited to this material, and the lead frame using copper material may be employed.

Embodiment 2

Figure 7:
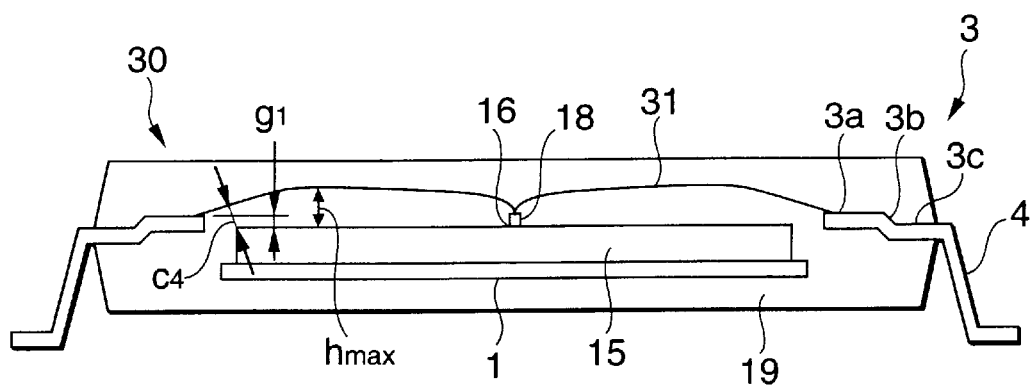
FIG. 7 is a sectional view showing a plastic packaged semiconductor device according to an embodiment 2 of the present invention.

FIG. 7 is a sectional view showing a plastic packaged semiconductor device according to an embodiment 2 of the present invention. In FIG. 7, reference numeral 31 denotes a bonding wire, and other configurations are similar to those in FIG. 1. As shown in FIG. 7, the bonding wire 31 is bonded to the electrode pad 16 by the hall bonding, then lifted gradually upwardly to form the loop, and then bonded onto the upper surface of the inner lead tip portion 3a of the inner lead 3 by the stitch bonding. In this case, a maximum lifting height $h_{max}$ of the bonding wire 31 is positioned over the semiconductor chip 15 to be shifted from an intermediate point between the electrode pad 16 and the end portion of the semiconductor chip 15 on the above inner lead tip portion 3a side to the end portion side of the semiconductor chip 15. According to this configuration, the thin small plastic packaged semiconductor device 30 can be achieved in which a shortest interval $c_4$ between the edge of the semiconductor chip 15 and the bonding wire 31 can be set large in the limited thickness of the sealing plastic 19 in the package to thus allow the large margin of the tolerance.

Embodiment 3

Figure 8:
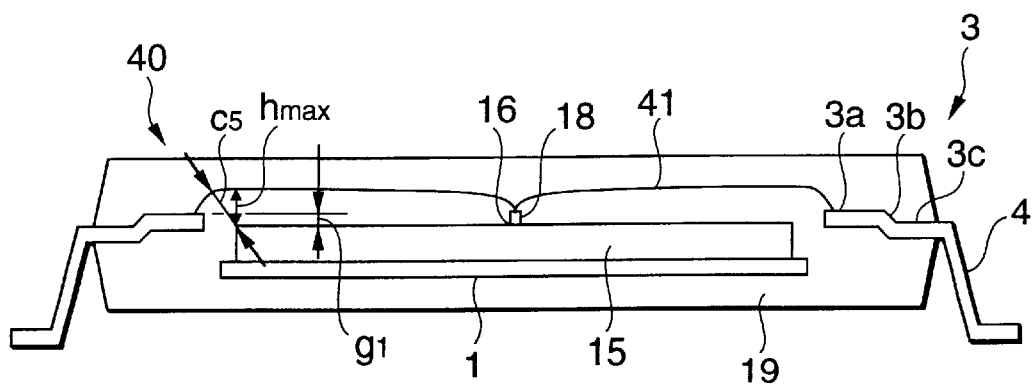
FIG. 8 is a sectional view showing a plastic packaged semiconductor device according to an embodiment 3 of the present invention.

FIG. 8 is a sectional view showing a plastic packaged semiconductor device according to an embodiment 3 of the present invention.

In FIG. 8, reference numeral 41 denotes a bonding wire, and other configurations are similar to those in FIG. 1. As shown in FIG. 7, the bonding wire 41 is bonded to the electrode pad 16 by the ball bonding, then lifted gradually upwardly to form the loop such that a maximum lifting height $h_{max}$ of the bonding wire 31 is positioned in the neighborhood of the end portion of the semiconductor chip 15, and then bonded onto the upper surface of the inner lead tip portion 3a of the inner lead 3 by the stitch bonding. According to this configuration, the thin small plastic packaged semiconductor device 40 can be achieved in which a shortest interval $c_5$ between the edge of the semiconductor chip 15 and the bonding wire 41 can be set further large.

Embodiment 4

Figure 9:
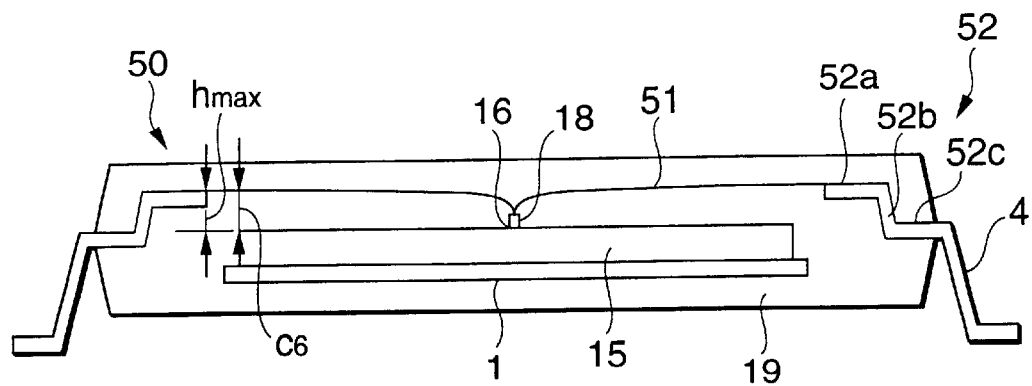
FIG. 9 is a sectional view showing a plastic packaged semiconductor device according to an embodiment 4 of the present invention.

FIG. 9 is a sectional view showing a plastic packaged semiconductor device according to an embodiment 4 of the present invention.

In FIG. 9, reference numeral 52 denotes an inner lead. An inner lead tip portion 52a is bent further upwardly from an inner lead root portion 52c via a bent portion 52b. A position of an upper surface of the inner lead tip portion 52a is formed highly up to a height position which is equivalent to the maximum lifting height $h_{max}$ obtained after the bonding wire 51 has been bonded by the ball bonding. In other words, a distance between height levels of the upper surface of the semiconductor chip 15, which is mounted on the die pad 1, and the upper surface of the inner lead tip portion 52a corresponds to the maximum lifting height $h_{max}$. Then, as shown in FIG. 9, the bonding wire 51 is bonded to the electrode pad 16 by the ball bonding, then lifted upwardly, and then bonded onto the upper surface of the inner lead tip portion 52a which gives the maximum lifting height $h_{max}$. According to this configuration, a shortest interval $c_6$ between the edge of the semiconductor chip and the bonding wire 51 can have the largest value which is almost close to the maximum lifting height $h_{max}$ of the bonding wire 51. Thus, a thin small plastic packaged semiconductor device 50 which can allow the large margin of the tolerance and achieve high reliability can be obtained.

In light of the controllability in forming the loop, it may be selected appropriately whether or not the bonding wire is formed in any manner shown in FIG. 1 and FIGS. 7 to 9.

Embodiment 5

Figure 10:
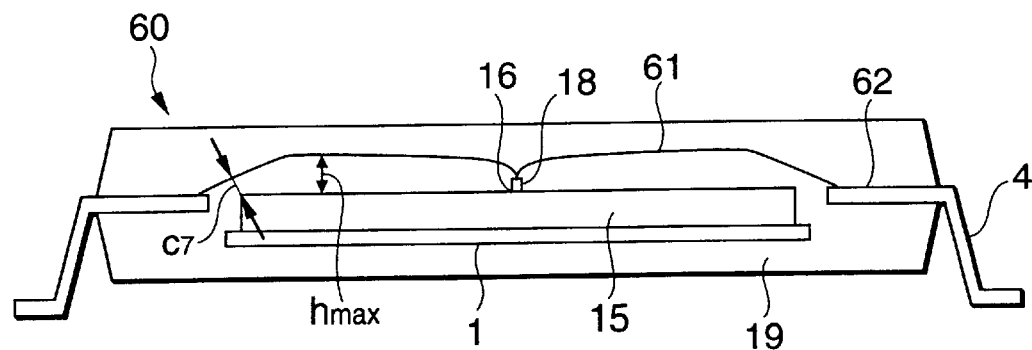
FIG. 10 is a sectional view showing a plastic packaged semiconductor device according to an embodiment 5 of the present invention.

FIG. 10 is a sectional view showing a plastic packaged semiconductor device according to an embodiment 5 of the present invention.

In FIG. 10, an upper surface of an inner lead 62 is formed at the same level as the upper surface of the semiconductor chip 15. Like the bonding wire 31 in the embodiment 2, a bonding wire 61 is formed such that the maximum lifting height $h_{max}$ can be positioned in the range from the intermediate point between the electrode pad 16 and the end portion of the semiconductor chip 15 to the end portion side of the semiconductor chip 15. According to this configuration, a thin small plastic packaged semiconductor device 60 having a shortest interval $c_7$ which is shorter than a desired shortest interval between the edge of the semiconductor chip and the bonding wire 61 can be obtained. In this case, it is of course that the bonding wire 61 may be formed to have the same shape of the bonding wire 41 in the embodiment 3.

The present invention having the above configuration can achieve following advantages.

The lead frame according to the present invention comprises the die pad on which the semiconductor chip having the electrode pad in the central portion of the upper surface is die-bonded, the lifted leads which support the die pad, and the inner leads which are arranged in close vicinity of the die pad and have tip portions having their upper flat surfaces, which are in parallel with the surface of the die pad and to which the bonding wires are connected. Then, the upper flat surfaces of the inner lead tip portions are arranged at a position higher than the upper surface of the semiconductor chip by at least a dimension which is equivalent to the diameter of the bonding wire. Therefore, the lead frame which makes it possible to prevent the bonding wires from contacting the edge of the semiconductor chip during the wire bonding step can be provided.

Also, the upper flat surfaces of the inner lead tip portions are arranged at the almost same height as the maximum lifting height of the bonding wires to be connected. Therefore, the lead frame which makes it possible to prevent the contact of the bonding wires to the edge of the semiconductor chip during the wire bonding step with further large tolerance can be obtained.

In addition, the plastic packaged semiconductor device according to the present invention comprises the semiconductor chip which has the electrode pad arranged in the central portion of the upper surface, the die pad to which the semiconductor chip is die-bonded, the bonding wires connected to the electrode pad, the inner leads which are arranged in close vicinity of the die pad and have tip portions having upper flat surfaces which are positioned at a level equal to or higher than the upper surface of the semiconductor chip and onto which the bonding wires are connected, and the sealing plastic for sealing the semiconductor chip, the die pad, the bonding wires, and the inner leads. Therefore, the small thin plastic packaged semiconductor device of high reliability which makes it possible to prevent the contact of the bonding wires to the edge of the semiconductor chip can be provided.

Furthermore, the upper flat surfaces of the inner lead tip portions are arranged at a position higher than the upper surface of the semiconductor chip by at least a dimension which is equivalent to the diameter of the bonding wires or a dimension which is equivalent to the maximum lifting height of the bonding wires. Therefore, the small thin plastic packaged semiconductor device of high reliability which makes it possible to prevent the contact of the bonding wires to the edge of the semiconductor chip with further large tolerance can be obtained.

Moreover, the position of the maximum lifting height of the bonding wires is arranged over the semiconductor chip in the range from the intermediate point between the electrode pad to which the bonding wires are connected and the end portion of the semiconductor chip on the corresponding inner lead side to the end portion side of the semiconductor chip and also arranged in the neighborhood of the end portion of the semiconductor chip, to which the bonding wires are connected, on the inner lead side. Therefore, the small thin plastic packaged semiconductor device of high reliability which makes it possible to prevent the contact of the bonding wires to the edge of the semiconductor chip with further large tolerance can be obtained.

What is claimed is:

1. A plastic packaged semiconductor device comprising:

a die pad on which a semiconductor chip having an electrode pad in a central portion of an upper surface is die-bonded;

lifting leads which support the die pad; and inner leads which are arranged in close vicinity of the die pad and have tip portions having upper flat surfaces, which are in parallel with a surface of the die pad and to which bonding wires are connected, the inner leads being bent upwardly in the semiconductor device to avoid contact between the bonding wires and an end portion of the semiconductor chip, wherein the upper flat surfaces of the tip portions of the inner leads are arranged higher than the upper surface of the semiconductor chip by at least 20 $\mu$m, with the tip portions of the inner leads being laterally spaced from the end portion of the semiconductor chip and the bonding wires extend from the electrode pad past the end portion of the semiconductor chip.

2. The plastic packaged semiconductor device according to claim 1, wherein the bonding wires are formed from gold.

3. A plastic packaged semiconductor device comprising:

a die pad on which a semiconductor chip having an electrode pad in a central portion of an upper surface is die-bonded;

lifting leads which support the die pad; and inner leads which are arranged in close vicinity of the die pad and have tip portions having upper flat surfaces, which are in parallel with a surface of the die pad and to which bonding wires are connected, the inner leads being bent upwardly in the semiconductor device to avoid contact between the bonding wires and an end portion of the semiconductor chip, wherein the upper flat surfaces of the tip portions of the inner leads are arranged at a substantially same height as a maximum lifting height of the bonding wires which are connected to the electrode pad, then lifted to form a loop, and then connected to the upper flat surfaces, with the tip portions of the inner leads being laterally spaced from the end portion of the semiconductor chip and the bonding wires extend from the electrode pad past the end portion of the semiconductor chip.

4. A plastic packaged semiconductor device comprising:

a semiconductor chip which has an electrode pad arranged in a central portion of an upper surface;

a die pad to which the semiconductor chip is die-bonded;

bonding wires connected to the electrode pad;

inner leads which are arranged in close vicinity of the die pad and have tip portions having upper flat surfaces which are positioned at a level equal to or higher than an upper surface of the semiconductor chip and to which the bonding wires are connected, the inner leads being bent upwardly in the semiconductor device to avoid contact between the bonding wires and an end portion of the semiconductor chip, wherein a position of a maximum lifting height of the bonding wires is arranged over the semiconductor chip in a range from an intermediate point between the electrode pad to which the bonding wires are connected and an end portion of the semiconductor chip on a corresponding inner lead side to the end portion side of the semiconductor chip; and a sealing plastic for sealing the semiconductor chip, the die pad, the bonding wires, and the inner leads, wherein the tip portions of the inner leads being laterally spaced from the end portion of the semiconductor chip and the bonding wires extend from the electrode pad past the end portion of the semiconductor chip.

5. The plastic packaged semiconductor device according to claim 4, wherein the upper flat surfaces of the tip portions of the inner leads are arranged more highly than the upper surface of the semiconductor chip by at least 20 $\mu$m.

6. The plastic packaged semiconductor device according to claim 4, wherein the upper flat surfaces of the tip portions of the inner leads are arranged more highly than the upper surface of the semiconductor chip by a dimension which is equivalent to a maximum lifting height of the bonding wires which are connected to the upper flat surfaces.

7. The plastic packaged semiconductor device according to claim 4, wherein a position of a maximum lifting height of the bonding wires is arranged in a neighborhood of the end portion of the semiconductor chip, to which the bonding wires are connected, on an inner lead side.

* * * * *